(12) United States Patent
Cannon et al.

(10) Patent No.: US 7,791,123 B2
(45) Date of Patent: Sep. 7, 2010

(54) SOFT ERROR PROTECTION STRUCTURE EMPLOYING A DEEP TRENCH

(75) Inventors: Ethan H. Cannon, Essex Junction, VT (US); John E. Barth, Jr., Williston, VT (US); Kerry Bernstein, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 12/045,190

(22) Filed: Mar. 10, 2008

(65) Prior Publication Data

US 2009/0224304 A1 Sep. 10, 2009

(51) Int. Cl.
*H01L 27/108* (2006.01)
(52) U.S. Cl. ..................... 257/297; 257/301
(58) Field of Classification Search .......... 257/297–301
See application file for complete search history.

(56) References Cited

U.S. PATENT DOCUMENTS

| | | | |
|---|---|---|---|
| 6,281,068 B1* | 8/2001 | Coronel et al. | 438/243 |
| 6,452,224 B1* | 9/2002 | Mandelman et al. | 257/296 |
| 6,639,264 B1* | 10/2003 | Loh | 257/301 |
| 6,703,273 B2* | 3/2004 | Wang et al. | 438/243 |
| 6,713,814 B1* | 3/2004 | Koscielniak | 257/330 |
| 2005/0184326 A1* | 8/2005 | Cheng | 257/301 |

* cited by examiner

*Primary Examiner*—Douglas M Menz
(74) *Attorney, Agent, or Firm*—Scully, Scott, Murphy & Presser, P.C.; H. Daniel Schnurmann

(57) ABSTRACT

A deep trench containing a doped semiconductor fill portion having a first conductivity type doping and surrounded by a buried plate layer having a second conductivity type doping at a lower portion is formed in a semiconductor layer having a doping of the first conductivity type. A doped well of the second conductivity type abutting the buried plate layer is formed. The doped semiconductor fill portion functions as a temporary reservoir for electrical charges of the first conductivity type that are generated by a radiation particle, and the buried plate layer functions as a temporary reservoir for electrical charges of the second conductivity type. The buried plate layer and the doped semiconductor fill portion forms a capacitor, and provides protection from soft errors to devices formed in the semiconductor layer or the doped well.

12 Claims, 8 Drawing Sheets

SOFT ERROR PROTECTION STRUCTURE EMPLOYING A DEEP TRENCH

FIELD OF THE INVENTION

The present invention relates to semiconductor structures, and particularly, to a semiconductor structure providing soft error protection by employing a deep trench, and methods of manufacturing the same.

BACKGROUND OF THE INVENTION

Soft errors from radiation particles, which are also known as single event upsets (SEU's), are a large concern in high reliability applications. In chips with even a moderate amount of unprotected static random access memory (SRAM) arrays, soft errors can dominate the error rate. Soft errors in latches are a growing concern in terrestrial applications for the 90 nm semiconductor technology and beyond. Soft errors are a greater concern in high radiation applications, such as aerospace or military applications.

Soft errors are caused by electrical charges as a radiation particle, such as an alpha particle, a charged ion, or any charged particle capable of generating electron-hole pairs as it travels through a semiconductor material such as doped wells. Electrical charges collected in such doped wells or any doped portion of a semiconductor substrate is typically dissipated through a well contact or a substrate contact. In many instances, however, the doped wells and the semiconductor substrate are configured to form parasitic bipolar transistors. Thus, when the amount of charge generated by the radiation particle within a doped well or a semiconductor substrate causes an excessive transient voltage, the parasitic transistors may turn on, causing a change in the stored data in a memory device, such as an SRAM cell.

Many known circuit techniques employed to reduce the soft error sensitivity of a circuit result in reduced areal circuit density and/or performance degradation. Fault tolerant systems can detect most or all soft errors and correct some of them, at the expense of greater complexity, and often, of performance penalties. Further, charges collected in a doped well are dissipated more rapidly as well contact spacing is reduced, thus reducing sensitivity to soft errors. However, the reduction in the well contact spacing results in a less dense circuit, i.e., a reduction in effective areal circuit density.

In general, such soft error problems are more severe in bulk substrates than in semiconductor-on-insulator (SOI) substrates. Specifically, at a given lithographic node, SOI circuits have lower soft error rates than comparable bulk circuits. The soft error rate of SOI SRAMs is often less than 20 percent of that of comparable bulk SRAMs. SOI semiconductor devices have a lower soft error rate because the volume of the semiconductor material that can collect charges generated by ionizing radiation is confined above the buried oxide (BOX). Bulk semiconductor devices have a much higher soft error rate because the volume of the semiconductor material sensitive to ionizing radiation extends at least as deep as the thickness of doped wells. In this regard, SOI substrates offer greater radiation immunity than bulk substrates. Due to the inherently higher SEU rate of devices built on a bulk substrate, the MOSFET devices built in the bulk portion of the semiconductor substrate are as prone to high soft error rates as equivalent devices built on a bulk substrate.

Therefore, there exists a need for structures for reducing soft error rates on semiconductor devices in a semiconductor substrate, and particularly in a bulk substrate, and methods of manufacturing the same.

Particularly, there exists a need for a semiconductor structure that provides reduction in voltage fluctuation during charge-generating events by a radiation particle without penalty in areal circuit density or performance, and methods of manufacturing the same.

SUMMARY OF THE INVENTION

The present invention provides a semiconductor structure comprising a deep trench capacitor that provides additional capacitance for an adjacent semiconductor well and a semiconductor substrate so that the magnitude of a voltage surge, and consequently, the frequency of a soft error, due to a radiation particle are reduced. The present invention also provides methods of manufacturing such a structure.

According to the present invention, a deep trench is formed in a semiconductor layer having a doping of a first conductivity type and located in a semiconductor substrate. A buried plate layer of a second conductivity type is formed around and outside a lower portion of the deep trench. A dielectric layer may be formed on a lower portion of the sidewall of the deep trench. A doped semiconductor material of the first conductivity type fills the deep trench such that a doped semiconductor fill portion laterally abuts the semiconductor layer. A doped well of the second conductivity type is formed abutting the buried plate layer. The buried plate layer and the doped semiconductor fill portion form a capacitor. The doped semiconductor fill portion functions as a temporary reservoir for electrical charges of the first conductivity type that are generated by a radiation particle, and the buried plate layer functions as a temporary reservoir for electrical charges of the second conductivity type, thereby reducing voltage fluctuations in the semiconductor layer and the doped well during charge-generating events, and consequently providing protection from soft errors to devices formed in the semiconductor layer or the doped well.

According to an aspect of the present invention, a semiconductor structure is provided, which comprises:

a semiconductor layer having a doping of a first conductivity type, located in a semiconductor substrate, and containing a trench;

a doped semiconductor fill portion having a doping of the first conductivity type, located in the trench, and laterally abutting the semiconductor layer at an upper portion of the trench;

a buried plate layer having a doping of a second conductivity type, surrounding a lower portion of the trench, and laterally abutting a sidewall of the trench, wherein the second conductivity type is the opposite of the first conductivity type; and a doped well of the second conductivity type abutting the buried plate layer.

According to another aspect of the present invention, a method of forming a semiconductor structure is provided, which comprises:

forming a trench in a semiconductor layer having a doping of a first conductivity type in a semiconductor substrate;

forming a buried plate layer having a doping of a second conductivity type directly on and outside a sidewall of a lower portion of the trench, wherein the second conductivity type is the opposite of the first conductivity type;

filling the trench with a doped semiconductor material having a doping of the first conductivity type to form a doped semiconductor fill portion, wherein the doped semiconductor fill portion laterally abuts the semiconductor layer at an upper portion of the trench; and forming a doped well of the second conductivity type in the semiconductor substrate, wherein the doped well abuts the buried plate layer.

BRIEF DESCRIPTION OF THE DRAWINGS

FIGS. 1, 2, and 3A are sequential vertical cross-sectional views. FIG. 3B is a horizontal cross-sectional view along the plane B-B' in FIG. 3A. FIG. 3C is a horizontal cross-sectional view along the plane C-C' in FIG. 3A.

DETAILED DESCRIPTION OF THE INVENTION

Figure 1:
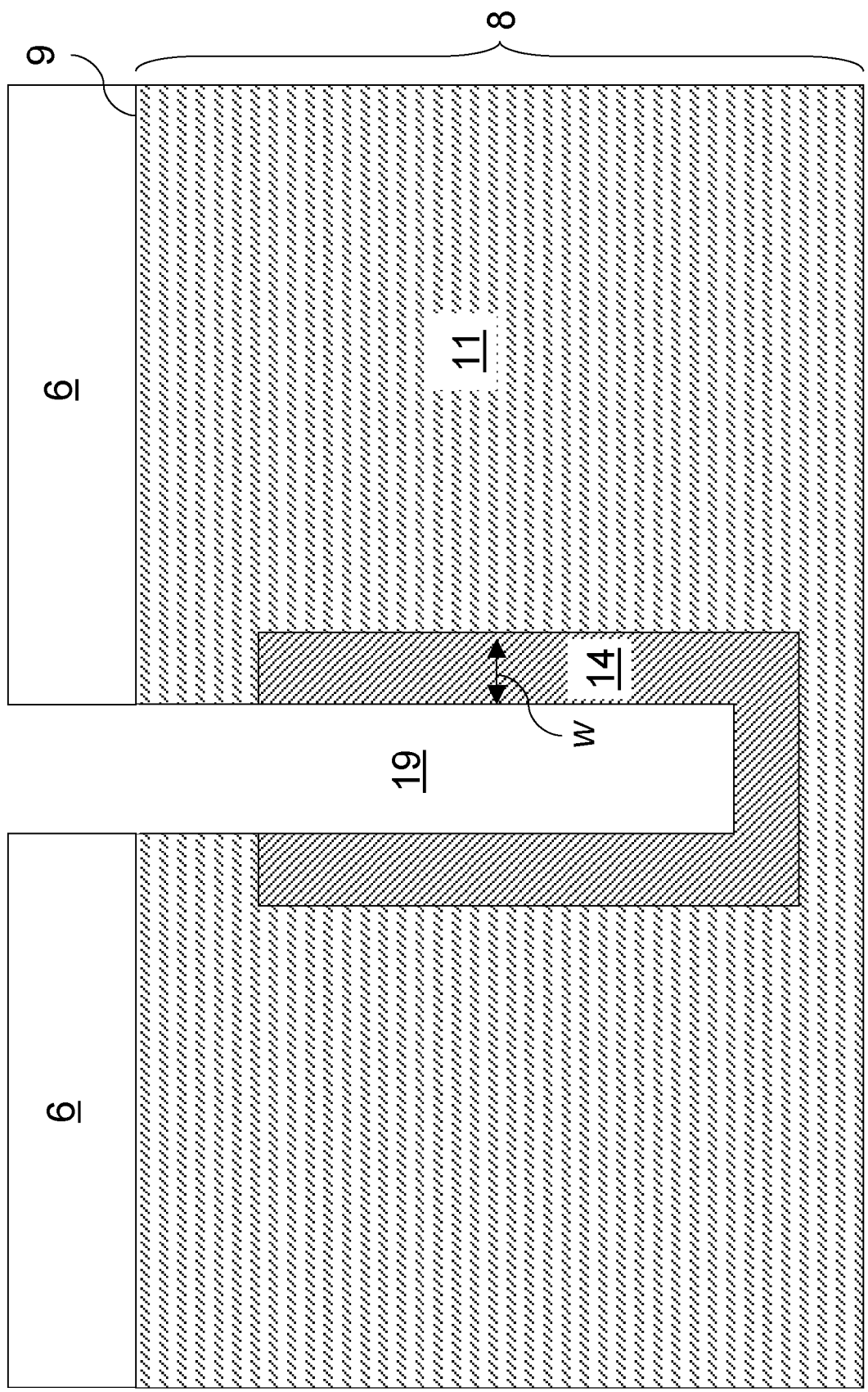
FIGS. 1, 2, and 3A-3C are views a first exemplary semiconductor structure according to a first embodiment of the present invention.

As stated above, the present invention relates to a semiconductor structure providing soft error protection by employing a deep trench, and methods of manufacturing the same, which are now described in detail with accompanying figures. It is noted that like reference numerals refer to like elements or like steps.

Referring to FIG. 1, a first exemplary semiconductor structure according to a first embodiment of the present invention comprises a semiconductor substrate 8 containing a semiconductor layer 11 and a deep trench 19 therein. Preferably, the semiconductor layer 11 comprises a single crystalline semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material comprises silicon. The semiconductor substrate 8 may be a bulk substrate or a hybrid substrate including at least one bulk portion. The semiconductor substrate 8 may have a built-in stress in the semiconductor layer 11. While the present invention is described with a bulk substrate, implementation of the present invention on a hybrid substrate is explicitly contemplated herein.

The deep trench 19 is formed by methods known in the art. Specifically, a masking layer (not shown), and a one pad layer 6 are formed on a top surface of the semiconductor substrate 8 and lithographically patterned to form an opening therein. The pad layer 6 comprises a dielectric oxide layer, a dielectric nitride layer, or a stack thereof. For example, the pad layer 6 may comprise a stack of a silicon oxide layer (not shown) and a silicon nitride layer (not shown). The silicon oxide layer may be located directly on the semiconductor layer 11 and have a thickness from about 1 nm to about 30 nm, and typically from about 3 nm to about 12 nm. The silicon nitride layer may be located on the silicon oxide layer and have a thickness from about 30 nm to about 300 nm, and typically from about 60 nm to about 200 nm. The masking layer comprises another dielectric material, which may be borosilicate glass (BSG), another hard mask material, or a photoresist.

The pattern in the masking layer and in the pad layer 6 is transferred into the semiconductor substrate 8 by an anisotropic etch. The exposed portion of the semiconductor substrate 8 is removed by the anisotropic etch to form the deep trench 19, which includes substantially vertical sidewalls and a bottom surface. The angle between the substantially vertical sidewalls of the deep trench 19 and a vertical line, i.e., a line perpendicular to a top surface of the semiconductor substrate 8, may be from 0 degree to about 5 degrees, and preferably, from 0 degree to about 2 degrees. The depth of the bottom surface of the deep trench 19 may be from about 1 micron to about 11 microns, and typically from about 3 microns to about 8 microns, although lesser and greater thicknesses are contemplated herein also. The deep trench is "deep" since the depth of the bottom surface exceeds the depth of other shallow trench isolation structures, which is filled with a dielectric material and has a depth less than 1 micron. The cross-sectional shape of the deep trench may be elliptical or polygonal. For example, the cross-sectional shape of the trench may be circular or rectangular. The cross-sectional shape of the deep trench 19 may, or may not vary with depth depending on the crystallographic orientations of the semiconductor substrate 8 and etch characteristics of the anisotropic etch employed to form the deep trench 19. The masking layer is subsequently removed.

The semiconductor layer 11, which is the entirety of the semiconductor substrate 8 outside the deep trench 19 at this point, has a doping of a first conductivity type, which may be p-type or n-type. In case the first conductivity type is p-type, typical dopants within the semiconductor layer 11 may be B, Ga, In, or a combination thereof. In case the first conductivity type is n-type, typical dopants within the semiconductor layer 11 may be P, As, Sb, or a combination thereof. The dopant concentration of the semiconductor layer 11 may be from about $1.0 \times 10^{15}/cm^3$ to about $3.0 \times 10^{19}/cm^3$, and typically from about $1.0 \times 10^{16}/cm^3$ to about $3.0 \times 10^{18}/cm^3$, although lesser and greater dopant concentrations are explicitly contemplated herein also.

A buried plate layer 14 is formed by introducing dopants of a second conductivity type through a lower portion of the sidewall of the deep trench 19 into the semiconductor layer 11. The second conductivity type is the opposite of the first conductivity type. For example, if the first conductivity type is p-type, the second conductivity type is n-type, and vice versa. Thus, the buried plate layer 14 has a doping of the second conductivity type. The buried plate layer 14 does not extend to a substrate top surface 9, which is the top surface of the semiconductor substrate 8. Methods of introducing dopants into a lower portion of a deep trench include outdiffusion from a dopant containing conformal layer, gas phase doping, plasma doping, and a combination thereof. The dopant concentration of the buried plate layer 14 may be from about $1.0 \times 10^{17}/cm^3$ to about $3.0 \times 10^{20}/cm^3$, and typically from about $1.0 \times 10^{18}/cm^3$ to about $3.0 \times 10^{19}/cm^3$, although lesser and greater dopant concentrations are explicitly contemplated herein also. The width w of the buried plate layer 14, as measured laterally between a substantially vertical inner surface of the buried plate layer 14 which coincides with the sidewall of the deep trench 19 and a substantially vertical outer surface of the buried plate layer 14, may be from about 30 nm to about 1 micron, and typically from about 100 nm to about 500 nm, although lesser and greater widths are explicitly contemplated herein also.

Figure 2:
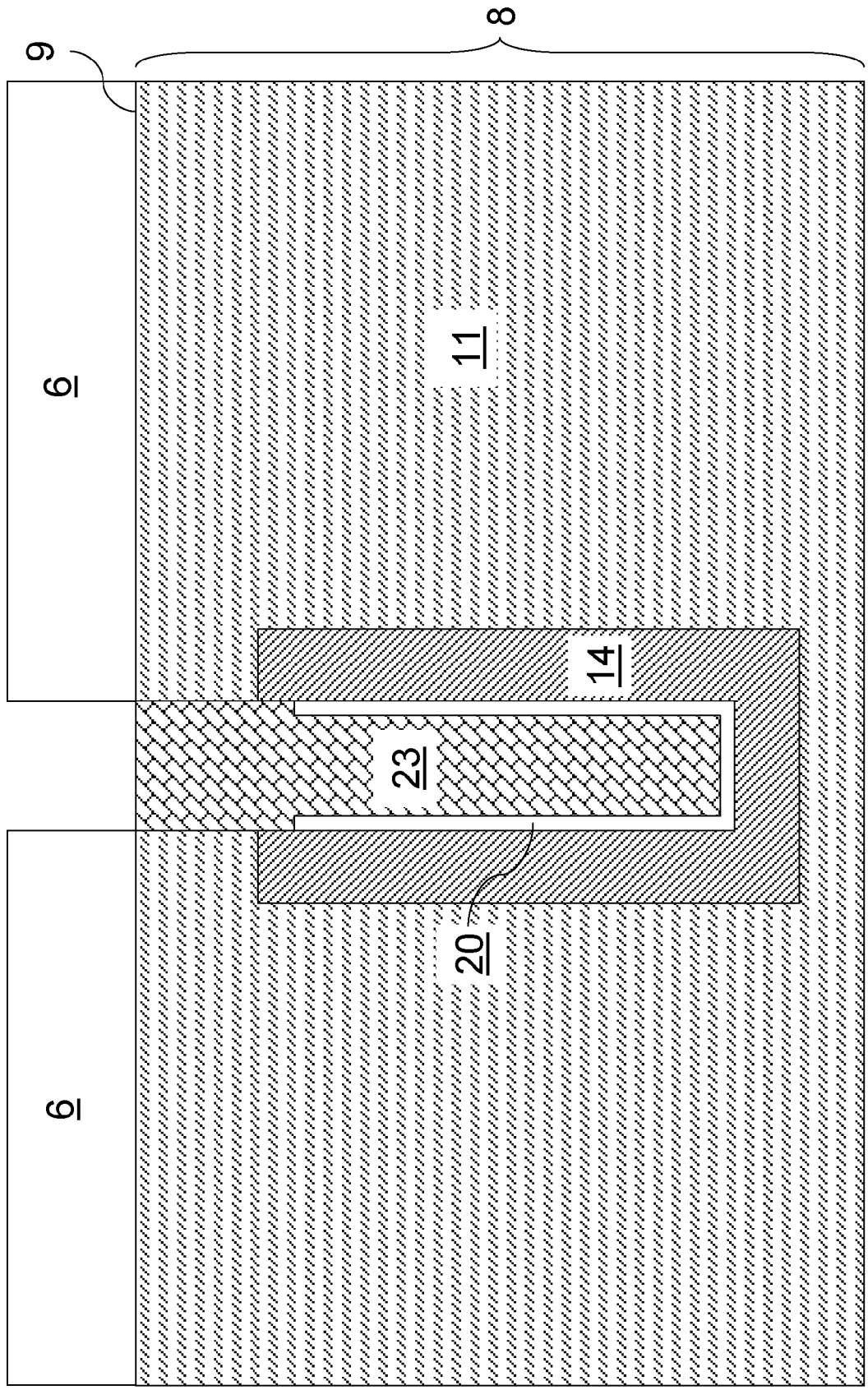

Referring to FIG. 2, a dielectric layer 20 is formed on a lower portion of the sidewall of the deep trench 19. The dielectric layer 20 comprises a dielectric material such as silicon oxide, silicon oxynitride, silicon nitride, or a combination thereof. For example, the dielectric layer 20 may comprise silicon nitride that is typically employed as a node dielectric in conventional deep trench capacitors. The dielectric layer 20 may be formed by thermal nitridation, thermal oxidation, low pressure chemical vapor deposition (LPCVD), and/or a combination thereof. The thickness of the dielectric layer 20 may be from about 2 nm to about 10 nm, and typically from about 3 nm to about 6 nm.

Various methods may be employed to cause formation of the dielectric layer 20 only on the lower portion of the sidewall of the deep trench 19. According to one method, a contiguous dielectric layer is formed on the entirety of the sidewall of the deep trench 19, followed by filling of the lower portion of the deep trench 19 with a temporary fill material, then followed by removal of the exposed portion of the contiguous dielectric layer above the temporary fill material so that the remaining portion of the contiguous dielectric layer constitutes the dielectric layer 20. According to another method, a contiguous dielectric layer is formed on the entirety of the sidewall of the deep trench 19, followed by deposition and recessing of a first semiconductor fill material within the deep trench and removal of the portion of the contiguous dielectric layer above a depth, followed by deposition of a second semiconductor fill material. The first and second semiconductor fill materials constitute a doped semiconductor fill portion 23.

While the present invention is described with the dielectric layer 20, it is noted that the present invention is practicable without a dielectric layer. Such structures and methods are explicitly contemplated herein.

In general, the doped semiconductor fill portion 23 is formed by deposition of at least one doped semiconductor material within the deep trench 19. If the dielectric layer 20 is present, the doped semiconductor fill portion 23 is formed directly on the dielectric layer 20. Thus, the doped semiconductor fill portion 23 laterally abuts the inner walls of the dielectric layer 20 and/or the inner walls of the buried plate layer 14. Further, the doped semiconductor fill portion 23 laterally abuts the semiconductor layer 11 at an upper portion of the deep trench 19.

The doped semiconductor fill portion 23 comprises a doped semiconductor material having a doping of the first conductivity type, and may be polycrystalline or amorphous. Thus, the conductivity type of the doping of the doped semiconductor fill portion 23 is the same as the conductivity of the semiconductor layer 11, and is the opposite of the conductivity type of the buried plate layer 14. The doped semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The dopant concentration of the doped semiconductor fill portion 23 may be from about $1.0 \times 10^{18}/cm^3$ to about $1.0 \times 10^{21}/cm^3$, and typically from about $1.0 \times 10^{19}/cm^3$ to about $5.0 \times 10^{20}/cm^3$, although lesser and greater dopant concentrations are explicitly contemplated herein also.

The doped semiconductor fill portion 23 is formed by deposition of the doped semiconductor material within the deep trench 19 to form a doped semiconductor material layer (not shown), which may be effected, for example, by low pressure chemical vapor deposition (LPCVD), rapid thermal chemical vapor deposition (RTCVD), etc. The portion of the doped semiconductor material layer above the pad layer 6 is planarized by chemical mechanical planarization (CMP) or a recess etch employing the pad layer 6 as a stopping layer. The portion of the doped semiconductor material layer above the substrate top surface 9 is removed by a recess etch. The top surface of the remaining portion of the doped semiconductor material layer, which constitutes the doped semiconductor fill portion 23, is substantially coplanar with the substrate top surface 9. The pad layer 6 is subsequently removed.

Figure 3A:
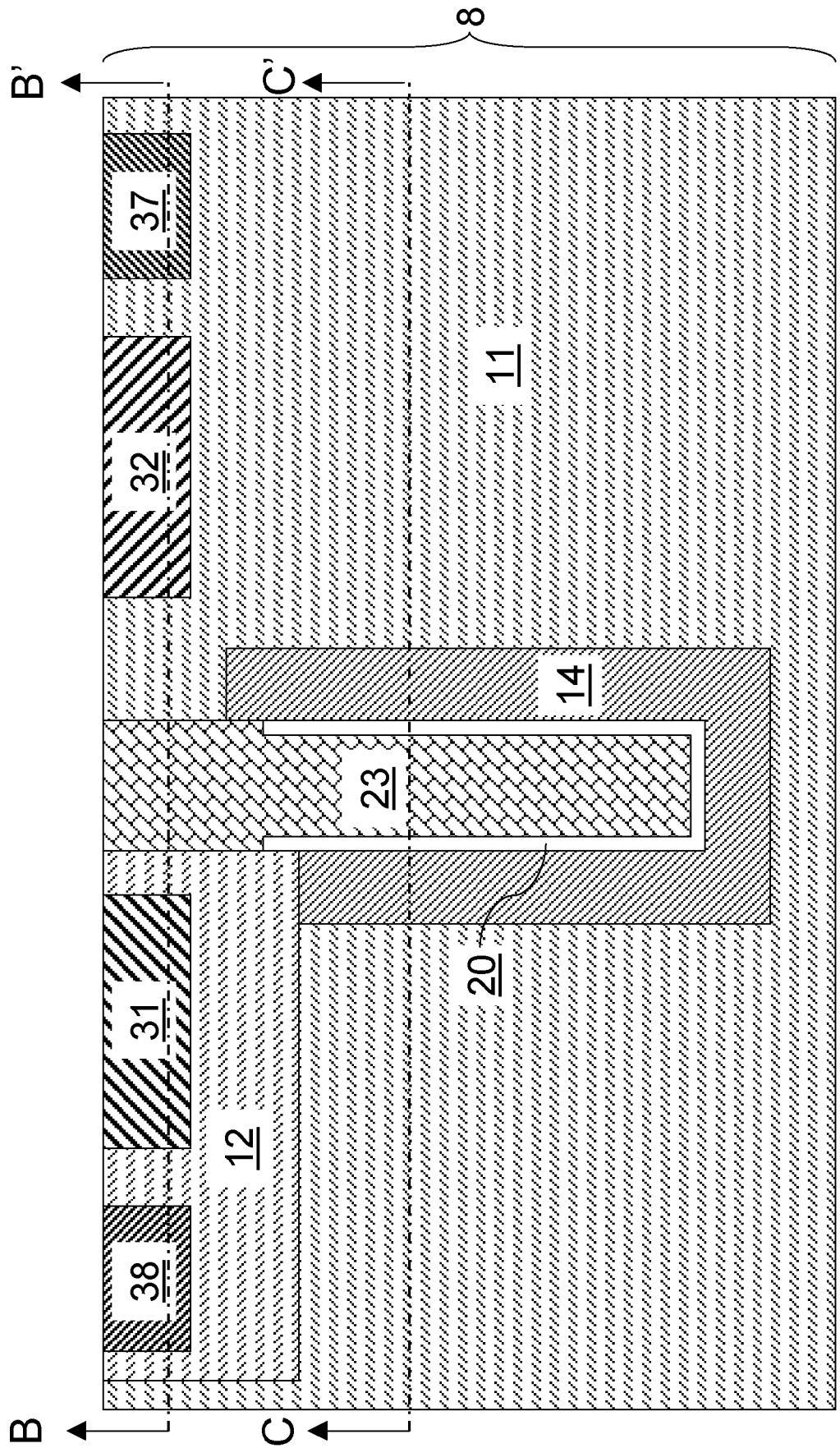
Figure 3B:
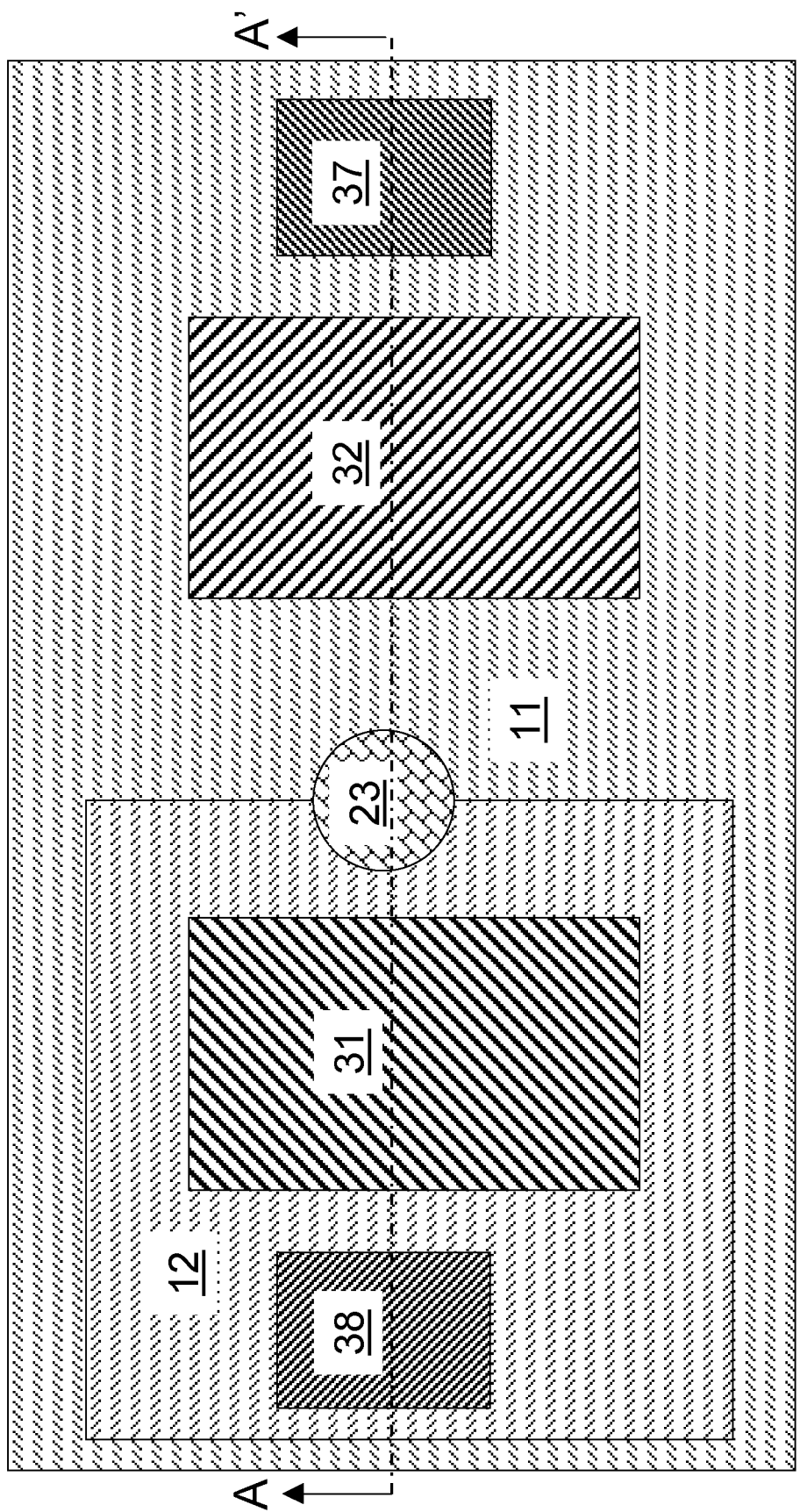
Figure 3C:
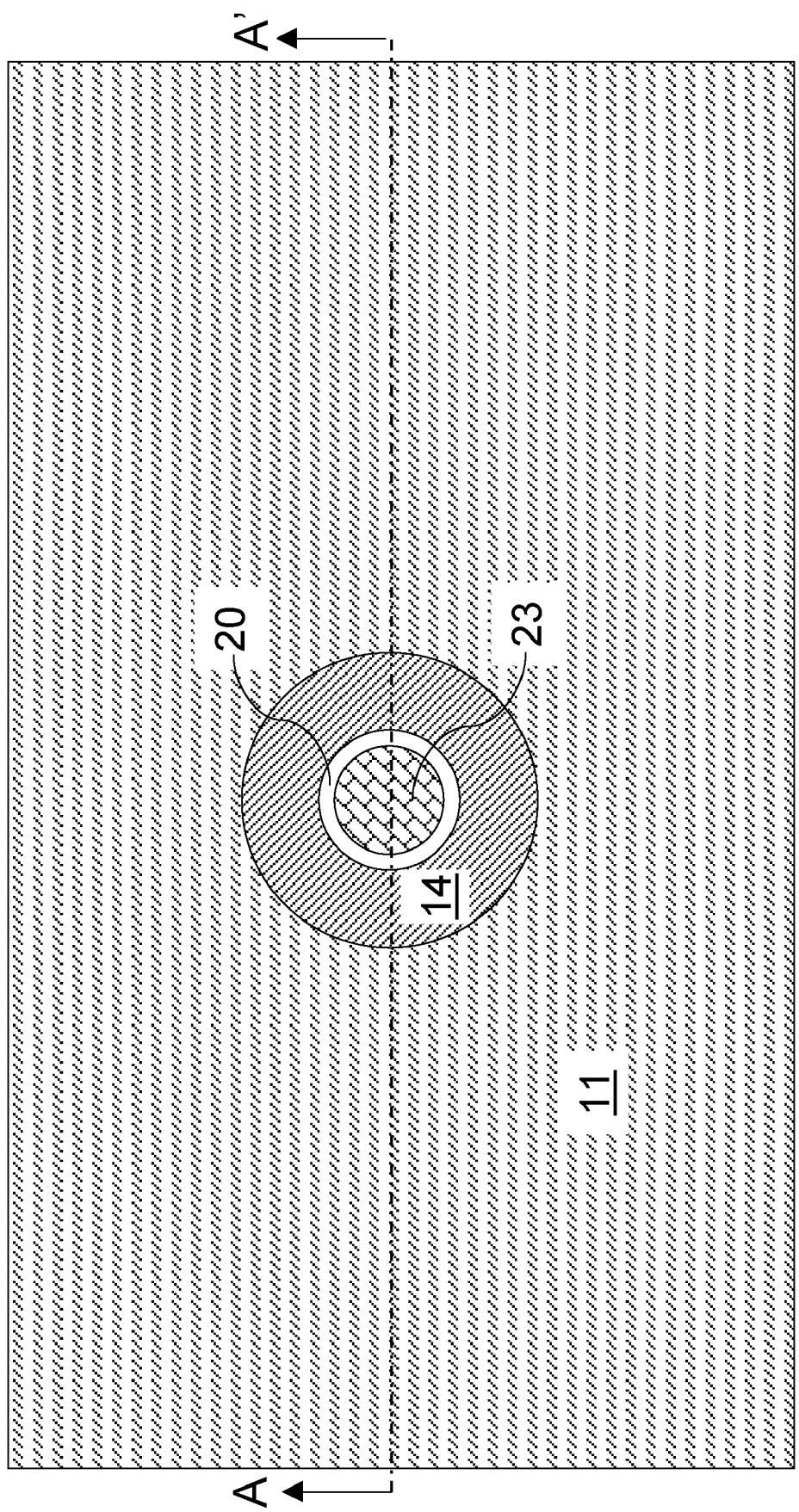

Referring to FIGS. 3A-3C, a doped well 12 having a doping of the second conductivity type is formed in the semiconductor substrate by doping a portion of the semiconductor layer 11 with dopants of the second conductivity type, for example, by masked ion implantation. The doped well 12 abuts the buried plate layer 14. Specifically, the depth of the doped well 12, i.e., the depth of the bottom surface of the doped well 12, is greater than the depth of a top surface of the buried plate layer 14. Further, the lateral location of the doped well 12 is selected such that the area of the doped well 12 as seen in a see-through top-down view overlaps the area of the buried plated layer 14 as seen in the same see-through top-down view. The doped well 12, having a doping of the second conductivity type, has the same type of doping as the buried plate layer 14, so that the doped well 12 and the buried plate layer 14 are electrically connected without a p-n junction therebetween. The dopant concentration of the doped well 12 may be from about $1.0 \times 10^{15}/cm^3$ to about $3.0 \times 10^{19}/cm^3$, and typically from about $1.0 \times 10^{16}/cm^3$ to about $3.0 \times 10^{18}/cm^3$, although lesser and greater dopant concentrations are explicitly contemplated herein also.

A first contact well 37 having a doping of the first conductivity type may be formed in the semiconductor layer 11, which also has a doping of the first conductivity type. The first contact well 37 typically has a higher dopant concentration than the semiconductor layer 11. The dopant concentration of the first contact well 37 may be from about $1.0 \times 10^{18}/cm^3$ to about $1.0 \times 10^{21}/cm^3$, and typically from about $1.0 \times 10^{19}/cm^3$ to about $5.0 \times 10^{20}/cm^3$, although lesser and greater dopant concentrations are explicitly contemplated herein also. The first contact well 37 may be employed to provide an electrical bias to the semiconductor layer 11.

A second contact well 38 having a doping of the second conductivity type may be formed in the doped well 12, which also has a doping of the second conductivity type. The second contact well 37 typically has a higher dopant concentration than the doped well 12. The dopant concentration of the second contact well 38 may be from about $1.0 \times 10^{18}/cm^3$ to about $1.0 \times 10^{21}/cm^3$, and typically from about $1.0 \times 10^{19}/cm^3$ to about $5.0 \times 10^{20}/cm^3$, although lesser and greater dopant concentrations are explicitly contemplated herein also. The second contact well 38 may be employed to provide an electrical bias to the doped well 12.

Semiconductor devices may be formed in and on the semiconductor layer 11 and the doped well 12. The semiconductor devices may include a first doped region 31 having a doping of the first conductivity type and formed in the doped well 12. For example, the first doped region 31 may be a source or a drain a field effect transistor (not shown) of the first conductivity type. If the first doped region has a p-type doping, the field effect transistor is a p-type field effect transistor, and if the first doped region has an n-type doping, the field effect transistor is an n-type field effect transistor.

The semiconductor devices may also include a second doped region 32 having a doping of the second conductivity type and formed in the semiconductor layer 11. For example, the second doped region 32 may be a source or a drain a field effect transistor (not shown) of the second conductivity type. If the second doped region has an n-type doping, the field effect transistor is an n-type field effect transistor, and if the second doped region has a p-type doping, the field effect transistor is a p-type field effect transistor.

Typically, the first contact well 37 is separated from the second doped region 32. However, variations in which the first contact well 37 abuts the second doped region 32 are explicitly contemplated herein. Likewise, the second contact well 38 is separated from the first doped region 31. However, variations in which the second contact well 38 abuts the first doped region 31 are explicitly contemplated herein.

In the first exemplary semiconductor structure, the doped well 12 laterally abuts the doped semiconductor fill portion 23 at an upper portion of the deep trench 19. Thus, a p-n junction is formed between the doped semiconductor fill portion 23 and the doped well 12. The buried plate layer 14 may, or may not, abut the doped semiconductor fill portion 23. Thus, a p-n junction may, or may not, be formed between the buried plate layer 14 and the doped semiconductor fill portion 23.

The first exemplary semiconductor structure provides protection against soft errors, or single event upsets (SEU's), to the semiconductor devices formed in and on the semiconductor layer 11 and the doped well 12. This is effected by the capacitance across a deep trench capacitor comprising the doped semiconductor fill portion 23 and the buried plate layer 14. The deep trench capacitor may, or may not, comprise the dielectric layer 20. Since the semiconductor layer 11 is electrically connected to the doped semiconductor fill portion 23 without any p-n junction therebetween, the capacitance of the deep trench capacitor is added to the capacitance between the semiconductor layer 11 and other elements abutting the semiconductor layer 11. Further, since the doped well 12 is electrically connected to the buried plate layer 14 without any p-n junction therebetween, the capacitance of the deep trench capacitor is added to the capacitance between the doped well 12 and other elements abutting the doped well 12.

Thus, the capacitance of the deep trench capacitor is added to the capacitance of the semiconductor layer 11 as far as the voltage change within the semiconductor layer 11 due to radiation particles is concerned. Also, the capacitance of the deep trench capacitor is added to the capacitance of the doped well 12 as far as the voltage change within the doped well 12 due to radiation particles is concerned.

In case the first conductivity type is p-type and the second conductivity type is n-type, the semiconductor layer 11 and the doped semiconductor fill portion 23 have a p-type doping and the doped well 12 and the buried plate layer 14 has an n-type doping. When a radiation particle generates electron-hole pairs in the semiconductor layer 11, the holes are eventually collected by the first contact well 37, and the electrons are eventually collected by the second contact well 38. The presence of the doped semiconductor fill portion 23 provides a temporary reservoir for the holes so that some of the holes flow into the doped semiconductor fill portion 23 immediately after the charge-generating event, and subsequently slowly released back into the semiconductor layer 11 and flow eventually into the first contact well 37. Thus, the voltage surge within the semiconductor region 11 due to the holes is mitigated. The buried plate layer 14 provides an easy access point for the electrons generated in the semiconductor region 11 due to the proximity to the semiconductor layer 11. Further, the buried plate layer 14 provides an extra volume for the electrons so that voltage surge within the semiconductor layer 11 and the doped well 12 is mitigated.

When a radiation particle generates electron-hole pairs in the doped well, the holes are eventually collected by the first contact well 37, and the electrons are eventually collected by the second contact well 38. The presence of the doped semiconductor fill portion 23 provides a temporary reservoir for the holes so that some of the holes flow into the doped semiconductor fill portion 23 immediately after the charge-generating event, and subsequently released into the semiconductor layer 11 slowly and flow eventually into the first contact well 37. Thus, the voltage surge within the doped well due to the holes is mitigated. The buried plate layer 14 provides an extra volume for the electrons so that voltage surge within the doped well 12 and the semiconductor layer 11 is mitigated.

In case the first conductivity type is n-type and the second conductivity type is p-type, the semiconductor layer 11 and the doped semiconductor fill portion 23 have an n-type doping and the doped well 12 and the buried plate layer 14 has a p-type doping. When a radiation particle generates electron-hole pairs in the semiconductor layer 11, the electrons are eventually collected by the first contact well 37, and the holes are eventually collected by the second contact well 38. The presence of the doped semiconductor fill portion 23 provides a temporary reservoir for the electrons so that some of the electrons flow into the doped semiconductor fill portion 23 immediately after the charge-generating event, and subsequently slowly released back into the semiconductor layer 11 and flow eventually into the first contact well 37. Thus, the voltage surge within the semiconductor region 11 due to the electrons is mitigated. The buried plate layer 14 provides an easy access point for the holes generated in the semiconductor region 11 due to the proximity to the semiconductor layer 11. Further, the buried plate layer 14 provides an extra volume for the holes so that voltage surge within the semiconductor layer 11 and the doped well 12 is mitigated.

When a radiation particle generates electron-hole pairs in the doped well, the electrons are eventually collected by the first contact well 37, and the holes are eventually collected by the second contact well 38. The presence of the doped semiconductor fill portion 23 provides a temporary reservoir for the electrons so that some of the electrons flow into the doped semiconductor fill portion 23 immediately after the charge-generating event, and subsequently released into the semiconductor layer 11 slowly and flow eventually into the first contact well 37. Thus, the voltage surge within the doped well due to the holes is mitigated. The buried plate layer 14 provides an extra volume for the holes so that voltage surge within the doped well 12 and the semiconductor layer 11 is mitigated.

Thus, the effect of the deep trench capacitor (14, 20, 23) is to provide a reservoir for temporary charges so that the temporary voltage swing in the semiconductor layer 11 or in the doped well 12 is mitigated after a charge-generating event from a radiation particle. Further, each of the semiconductor layer 11 and the doped well 12 is electrically connected to a node of the deep trench capacitor (14, 20, 23) without a p-n junction. Since the polarity of doping is opposite between the doped semiconductor fill portion 23 and the buried insulator layer 14, the deep trench capacitor (14, 20, 23) provides protection against soft error for both the semiconductor layer 11 and in the doped well 12.

Figure 4:
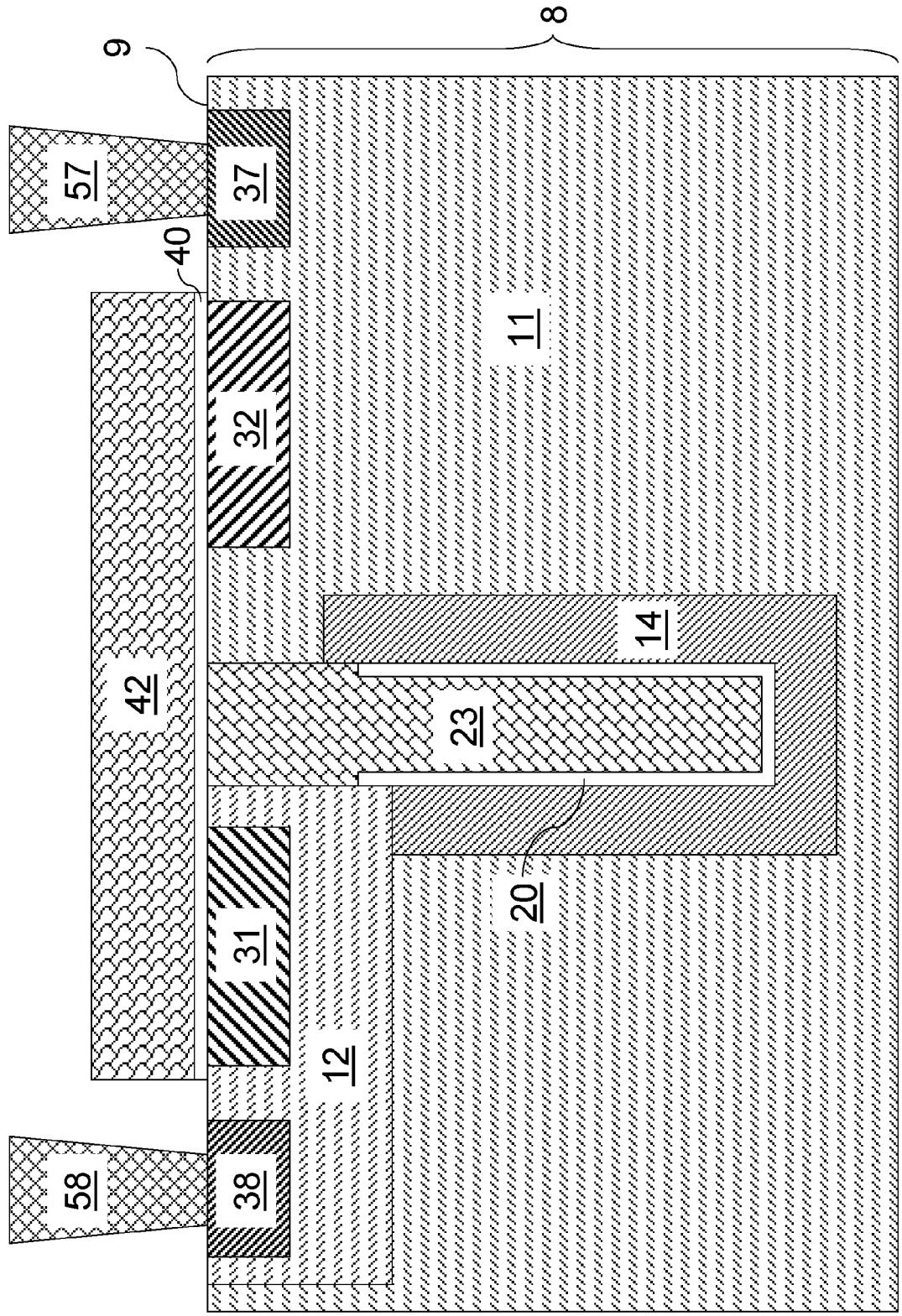
FIGS. 4, 5, and 6 are vertical cross-sectional views of second, third, and fourth exemplary semiconductor structures according to second, third, and fourth embodiment of the present invention, respectively.

Referring to FIG. 4, a second exemplary semiconductor structure according to a second embodiment of the present invention is derived from the first exemplary semiconductor structure in FIGS. 3A-3C by forming a gate dielectric 40 directly on portions of the substrate top surface 9 including the doped semiconductor fill portion 23, a portion of the semiconductor layer 11 abutting the doped semiconductor fill portion 23, and a portion of the doped well 12. Further, the gate dielectric 40 may be formed directly on the first doped region 31 and the second doped region. A gate conductor line 42 is also formed directly on the gate dielectric 40 such that the gate dielectric 40 and the gate conductor line 42 have substantially vertically coincident sidewalls. A stack of the gate dielectric 40 and the gate conductor line 42 may be formed, for example, by deposition of a gate dielectric layer (not shown) and a gate conductor layer (not shown) followed by lithographic patterning of the gate conductor layer and the gate dielectric layer by methods known in the art.

The area directly above the doped semiconductor fill portion 23 is available for routing the gate conductor line 42 since the top surface of the doped semiconductor fill portion 23 is substantially coplanar with the rest of the semiconductor substrate 9 including the top surfaces of the semiconductor layer 11, the doped well 12, the first doped region 31, the second doped region 32, the first contact well 37, and the second contact well 38.

A middle-of-line (MOL) dielectric layer (not shown) may be subsequently deposited and via holes may be formed therein. A first contact via 57 and a second contact via 58, each comprising a conductive material, may be formed directly on the first contact well 37 and the second contact well 38, respectively. The first contact via 57 and the second contact via 58 provide charge collection path for charges of the first conductivity type and the second conductivity type, respectively.

Figure 5:
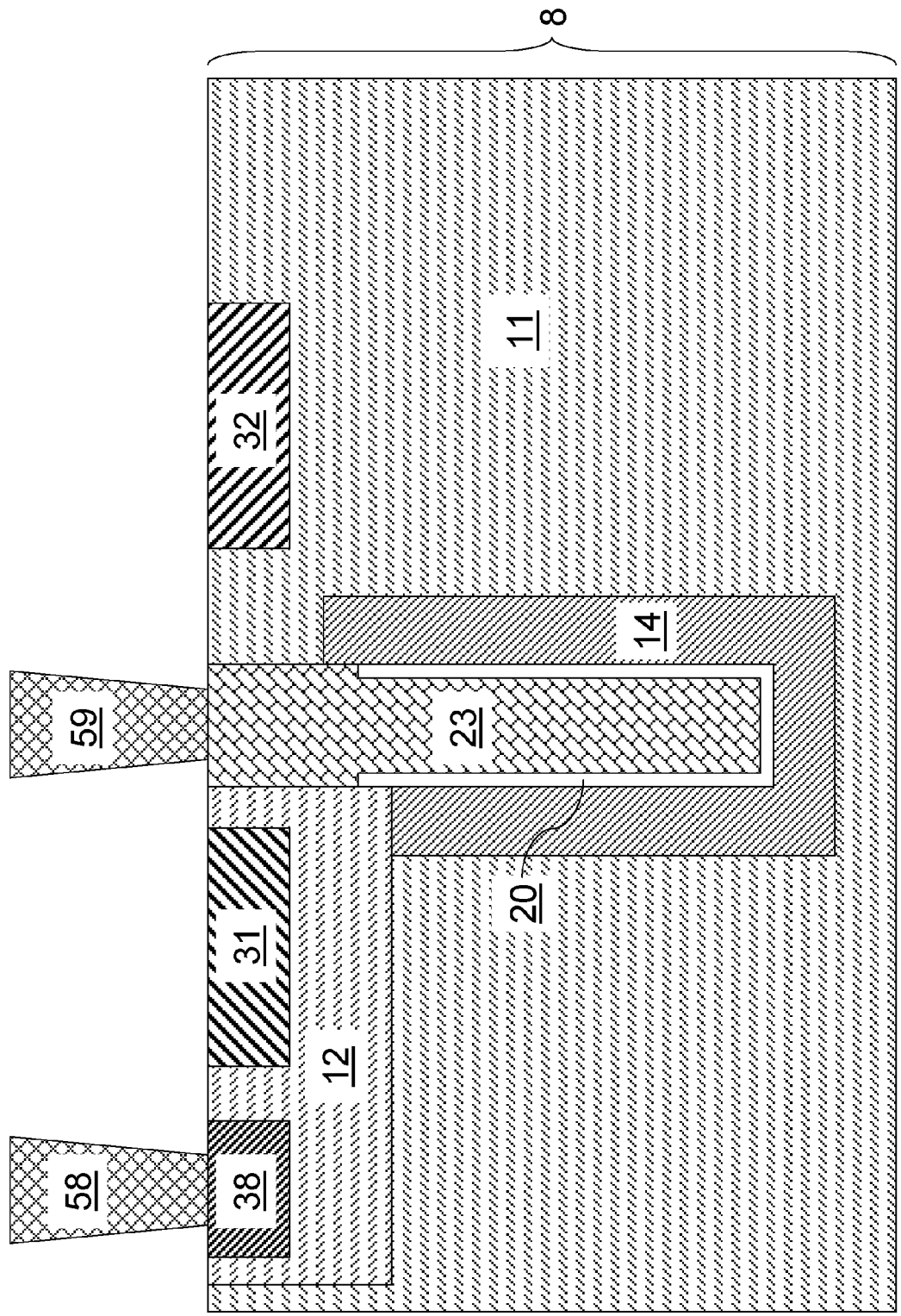

Referring to FIG. 5, a third exemplary semiconductor structure according to a third embodiment of the present invention is derived from the first exemplary semiconductor structure in FIGS. 3A-3C by omitting formation of a first contact well within the semiconductor layer 11, and forming a contact via 59 that vertically abuts the doped semiconductor fill portion 23. A second contact via 58 is formed directly on the second contact well 38 as in the second embodiment. Preferably, the contact via is separated from the doped well 59. The doped semiconductor fill portion 23 thus functions as a contact well to allow collection of charges of the first conductivity type. For example, if the semiconductor layer 11 has a p-type doping, holes are collected to a top portion of the doped semiconductor fill portion 23 and flows into the contact via 59 after electron-hole pair generation due to a radiation particle. If the semiconductor layer 11 has an n-type doping, electrons are collected to a top portion of the doped semiconductor fill portion 23 and flows into the contact via 59 after electron-hole pair generation due to a radiation particle.

Figure 6:
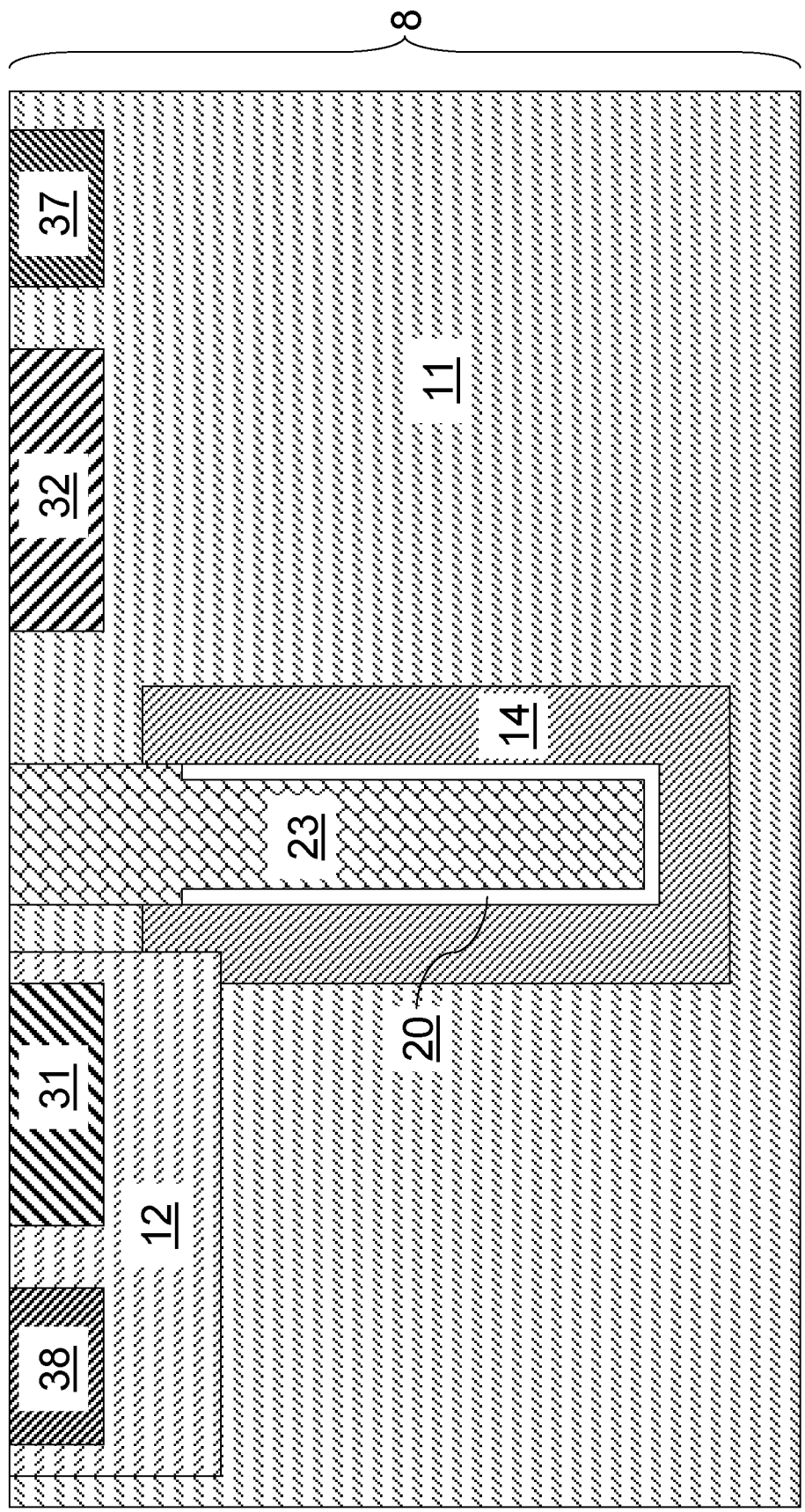

Referring to FIG. 6, a fourth exemplary semiconductor structure according to a fourth embodiment of the present invention is derived from the first exemplary semiconductor structure of FIGS. 3A-3C by placing the doped well 12 such that the doped well 12 does not laterally abut the doped semiconductor fill portion 23. The doped well 12, however, is directly adjoined to the buried plate layer 14 so that the doped well 12 and the buried plate layer 14 are connected to each other without any p-n junction therebetween. Additional structures shown in FIG. 4 or FIG. 5 may be formed thereafter.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
a semiconductor layer having a doping of a first conductivity type, located in a semiconductor substrate, and containing a trench, wherein said semiconductor layer contiguously, extends from a top surface of said semiconductor substrate at least to a depth about a bottommost surface of said trench in a vertical direction;
a doped semiconductor fill portion having a doping of said first conductivity type, located in said trench, contiguously extending to said top surface of said semiconductor substrate, and directly contacting surfaces of said semiconductor layer at an upper portion of said trench;
a buried plate layer having a doping of a second conductivity type, surrounding a lower portion of said trench, and laterally abutting a sidewall of said trench, wherein said second conductivity type is the opposite of said first conductivity type; and
a doped well of said second conductivity type abutting said buried plate layer and contiguously extending from said top surface of said semiconductor substrate at least to a topmost surface of said buried plate layer in said vertical direction.

2. The semiconductor structure of claim 1, further comprising:
a first doped region of said first conductivity type surrounded and abutted by said doped well; and
a second doped region of said second conductivity type surrounded and abutted by said semiconductor layer.

3. The semiconductor structure of claim 1, wherein an entirety of said semiconductor layer, said buried plate layer, and said doped well is single crystalline.

4. The semiconductor structure of claim 1, wherein said doped semiconductor fill portion is polycrystalline or amorphous.

5. The semiconductor structure of claim 1, wherein said semiconductor layer, said doped well, and said doped semiconductor fill portion have substantially coplanar top surfaces.

6. The semiconductor structure of claim 1, further comprising:
a first contact well having a doping of said first conductivity type and surrounded and abutted by said semiconductor layer;
a second contact well having a doping of said second conductivity type and surrounded and abutted by said doped well;
a first contact via vertically abutting said first contact well; and
a second contact via vertically abutting said second contact well.

7. The semiconductor structure of claim 1, further comprising a dielectric layer located directly on said sidewall of said trench, abutting said buried plate layer, and abutting said doped semiconductor fill portion.

8. The semiconductor structure of claim 1, wherein said doped well abuts said doped semiconductor fill portion.

9. The semiconductor structure of claim 1, wherein said doped well is separated from said doped semiconductor fill portion by said semiconductor layer.

10. The semiconductor structure of claim 1, further comprising:
a gate dielectric located directly on said doped semiconductor fill portion, said semiconductor layer, and said doped well; and
a gate conductor line located directly on said gate dielectric.

11. The semiconductor structure of claim 1, further comprising a contact via vertically abutting said doped semiconductor fill portion.

12. The semiconductor structure of claim 1, wherein said semiconductor layer has a first dopant concentration, said doped semiconductor fill portion has a second dopant concentration, and said second dopant concentration is higher than said first dopant concentration.

* * * * *